United States Patent [19]

Demeuré et al.

[11] Patent Number: 4,584,688
[45] Date of Patent: Apr. 22, 1986

[54] BASE FOR A SEMICONDUCTOR LASER

[76] Inventors: Loïc Demeuré, Route de Pleumeur; Jean Le Rouzic, Convenant an Dour, St Quay-Perros; Jean-Claude Simon, 23 rue de Trestrignel, all of 22700-Perros Guirec, France

[21] Appl. No.: 521,106

[22] Filed: Aug. 8, 1983

[30] Foreign Application Priority Data

Aug. 12, 1982 [FR] France ................................ 82 14042

[51] Int. Cl.⁴ ............................................. H01S 3/02
[52] U.S. Cl. ......................................... 372/36; 357/81
[58] Field of Search ..................... 372/36, 109; 357/81

[56] References Cited

FOREIGN PATENT DOCUMENTS

| 0014588 | 2/1978 | Japan | 372/36 |
| 0148483 | 11/1980 | Japan | 372/36 |
| 0104485 | 8/1981 | Japan | 372/36 |
| 2050896 | 1/1981 | United Kingdom | 372/36 |
| 2052140 | 1/1981 | United Kingdom | 372/36 |

OTHER PUBLICATIONS

Joyce et al., "Thermal Resistance of Heterostructure Lasers" *JAP*, vol. 46, No. 2, Feb. 1975, pp. 855-861.
Hutchins, "Copper Mesa Heat Sink for Heterojunction Lasers", *IBM Technical Disclosure Bulletin*, vol. 17, No. 1, Jun. 1974, p. 282.

Primary Examiner—James W. Davie
Attorney, Agent, or Firm—Michael N. Meller

[57] ABSTRACT

The base comprises a metal support having a planar holder and a prismatic part provided with a slot, in which a metal strip is brazed. The upper edge of the strip is polished and receives the laser chip. An interconnection wafer is brazed to the holder.

8 Claims, 5 Drawing Figures

BASE FOR A SEMICONDUCTOR LASER

BACKGROUND OF THE INVENTION

The present invention relates to a base for a semiconductor laser and to its production process.

A semiconductor laser base is a member which acts as a mechanical support for the semiconductor structure forming the seat of the laser effect, which permits a dissipation of the heat given off this structure and which facilitates electrical connections with a power supply.

In view of the extreme sensitivity of semiconductor lasers, the problem of providing an adequate base has always been one of the major preoccupations of specialists in this field. Generally, the base used is constituted by a monolithic metal support, whose upper face is polished and receives the laser chip. However, such a structure has the disadvantages that the upper surface of the base is convex after polishing as a result of its large size, which is prejudicial to a good thermal contact between chip and base, and access to the mirrors of the laser enveloping the semiconductor structure is very difficult once the assembly has been installed.

SUMMARY OF THE INVENTION

The object of the invention is to obviate these disadvantages by proposing a base for which the part receiving the laser chip is narrow and does not suffer from convexity and which also permits access to the laser mirrors.

According to the invention, this objective is achieved by a base for a semiconductor laser, comprising a monolithic metal support having a prismatic part formed by two planes inclined relative to a plane of symmetry, said prismatic part having a slot in said plane of symmetry, a metal strip being brazed into the slot, said strip having a polished upper edge for receiving a laser chip whose length is equal to the thickness of the strip, the support also having a planar holder, onto which is brazed a parallelepipedic interconnection wafer which is formed by an insulating substrate covered with a metal coating, which can be connected by a connection to the laser chip.

Preferably, the support and the strip are made from copper.

Preferably, the interconnection wafer is constituted by a fritted alumina substrate, one face of which is covered by a electrically conductive coating printed by a gold screen process, and whereof the other face of which (which) is to be in contact with the holder) is covered by a heat-conducting coating produced with the aid of a silver-palladium paste.

The invention also relates to a process for the production of the base defined hereinbefore. According to the invention, this process comprises the following operations:
  machining a metal support by milling and grinding in order to form the prismatic part and the holder;
  sawing a slot in the prismatic part and in the holder,
  producing a strip by rolling a metal sheet, cutting to the desired length, grinding on three edges and polishing the fourth edge,
  production of an interconnection wafer by screen process printing of a metal paste on an insulating substrate,
  introduction of the strip into the slot, the polished edge being in the upper part and fitting the interconnection wafer to the holder,
  brazing the strip and the wafer.

BRIEF DESCRIPTION OF THE DRAWINGS

The invention is described in greater detail hereinafter relative to non-limitative embodiments and the attached drawings, wherein.

DETAILED DESCRIPTION OF THE INVENTION

Figure 1:
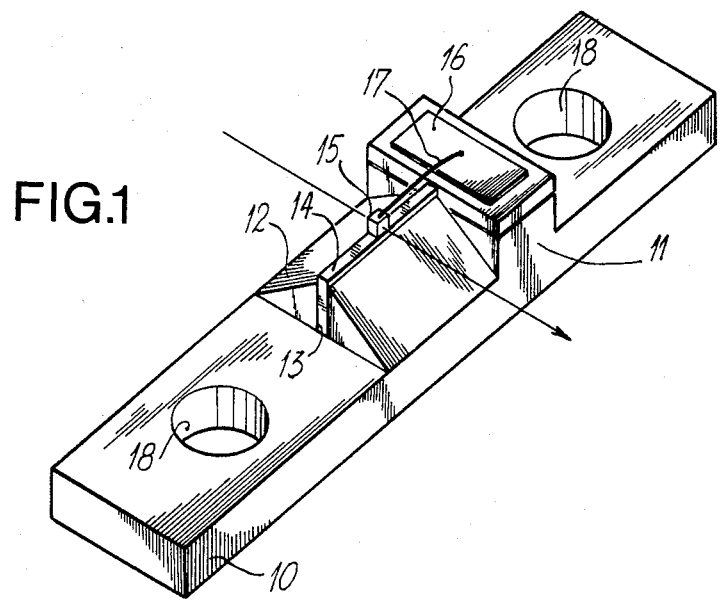
FIG. 1 is a general view of a base according to the invention.

The base shown in FIG. 1 comprises a monolithic metal support 10 having a prismatic part 12, formed by two planes inclined relative to the plane of symmetry of the assembly. This prismatic part has a slot 13 in the plane of symmetry. A metal strip 14 is brazed in the slot, said strip having a polished upped edge for receiving a laser chip 15. The length of this chip is equal to the thickness of the strip. Thus, the laser radiation is directed transverse to the plane of symmetry. The base also has a holder 11 on which is brazed a parallelepipedic interconnection wafer 16 which is connected to the laser chip 15 by a connection 17. The support can have mounting bores 18.

It is clear that the prismatic part 12 frees the laser chip and the mirrors, without being prejudicial to the thermal contact existing over the entire laser chip base.

The process for the production of such a base can comprise the following exemplified operations.

Figure 2:
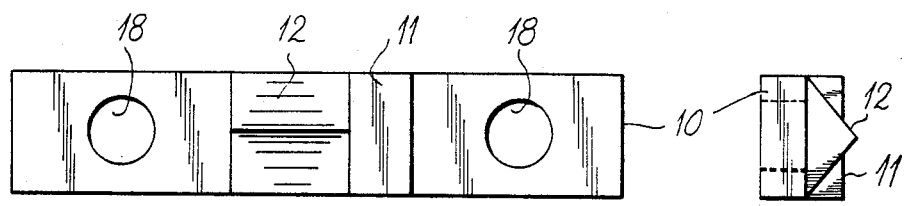
FIG. 2 shows the monolithic support.

The support is obtained by milling and grinding a round or stretched copper member, the copper being e.g. made, for example, of annealed Cu-Al. The part shown in FIG. 2, with its holder 11 and its prismatic part 12, is thereby obtained.

Figure 3:
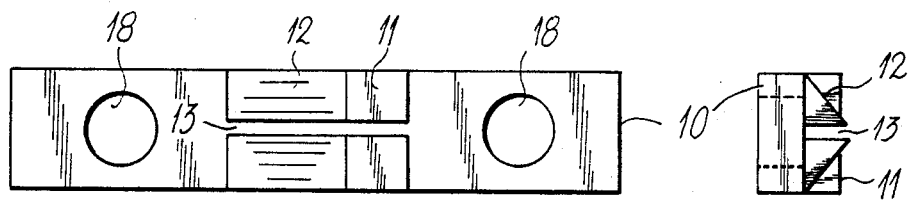
FIG. 3 shows the support after sawing.

Slot 13 is obtained by using a slitting saw of a width such that the desired width is obtained in a single pass. This width is equal to the thickness of the metal strip to be fitted, plus 30 and 40μm. This is followed by trimming, and then by cleaning with chlorinated or fluorinated solvents in an ultrasonic tank. The part obtained is shown in FIG. 3.

Figure 4:
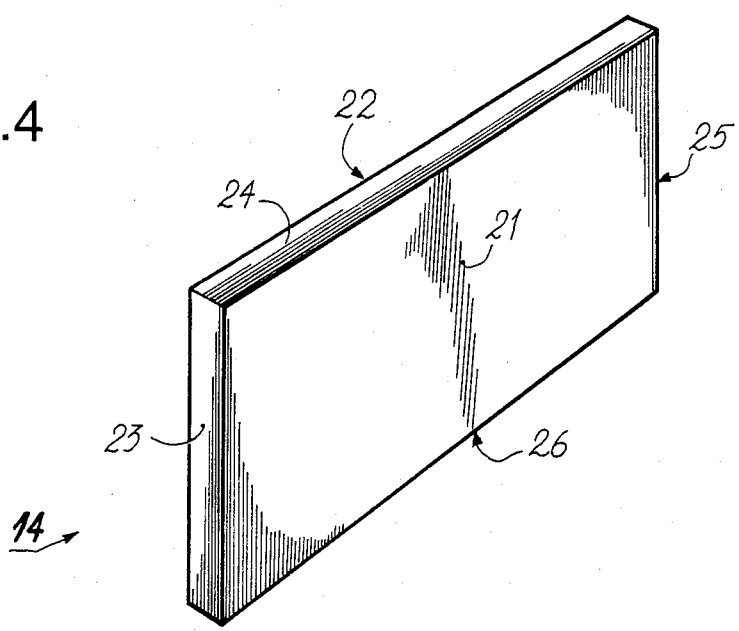
FIG. 4 depicts a strip.

As in the case of the support, the strip is preferably made from annealed Cu-Al. The material is stored in the form of sheets, from which can be drawn bands of width equal to 2.55mm and length approximately equal to 250mm. Each band is passed through a rolling mill, so that its thickness is equal to that of the strip ±1μm. The bands leaving the rolling mill are cut to a length of 4.5mm with the aid of a slitting saw. After cutting, the strips are cleaned with the aid of a chlorinated or fluorinated solvent. Each strip is then ground on three faces 23, 25, 26 (see FIG. 4), while faces 21 and 22 are not treated. The strips then undergo polishing on face 24 for receiving the laser chip. For this polishing operation, a block of strips is maintained in a special means (not shown) having two flanges, which bear on the lateral faces 21, 22 of two end strips of the block. After polishing the surfaces 24 of the strips forming the block, the strips are separated from one another. This procedure makes it possible to obtain a mirror-polished face 24, without forming convex surfaces at the edges. Only the edges of the means gripping the strips become convex.

Figure 5:
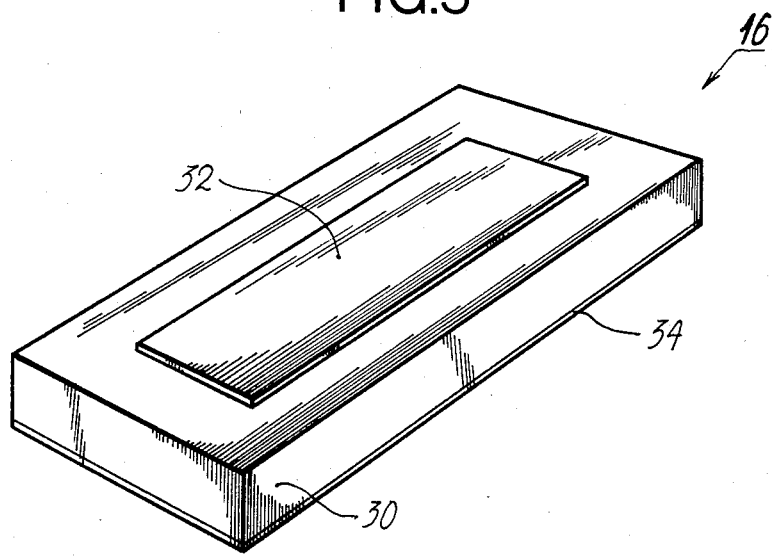
FIG. 5 depicts an interconnection wafer.

The interconnection wafer 16 is shown in FIG. 5 and comprises a fritted alumina substrate 30, covered with a conducting coating 32 used for interconnection purposes and produced by the screen process printing of a glass-free gold paste. The lower face which abuts the holder of the support when the wafer is mounted is covered by a coating 34 made from a silver-palladium paste. Several wafers can be simultaneously screen process printed and baked on an alumina substrate, which is then cut by means of laser beam machining equipment.

The strip 14 is fixed by soft brazing in the slot 13 made in the support. The addition alloy composition is chosen as a function of melting temperature and the thermal characteristics of the base. For example, for a temperature of 160° C., it is possible to use an alloy of 62.5% tin, 36% lead, and 1.5% silver, the melting of which is 179° C. For a temperature of 200° C., it is possible to use an alloy of 95% tin and 5% antimony, whose melting point is 250° C.

The operation of fitting the strip involves two steps, namely coating the faces of the slot with the addition metal and brazing of the strip.

The faces of the slot are coated by using a preform of the chosen addition alloy, so that only the slot is treated. This method is performed in the following way. Following cleaning with chlorinated or fluorinated solvents, the support of FIG. 3 is etched with a 5% hydrochloric acid solution. An addition alloy preform is prepared with the following dimensions:

length=length of the slot
thickness=thickness of the slot
width=400 to 600μm.

The preform is engaged, by centering in the slot in such a way that it is flush with the upper part. The support is raised to a temperature slightly above the melting point of the preform, e.g. by placing it on a hotplate. The preform melts and flows over the side and bottom surfaces defining the slot. Whilst the alloy is molten, a stainless steel strip is passed into the slot, this strip having a thickness equal to that of the slot, less 100μm. A reciprocating longitudinal movement is produced in the strip, which makes it possible to obtain a deposit without any extra thickness. The planar part of the support which is to receive the interconnection wafer is coated with the same alloy and the assembly is cooled by placing the support on a good thermal dissipator.

On the basis of the thus-prepared support, an alloy preform of the same type as that used previously is introduced into the slot, but its dimensions are:

length: 2mm
width: 0.6mm
thickness: same as the slot width, less 100μm.

The strip 14 is engaged in the slot, accompanied by its centering. The interconnection wafer is positioned on its support. The fitting support is raised to the melting temperature of the preform and a pressure is exerted on the ends of the strip to ensure contact of the strip with the bottom of the slot.

During this operation, the strip and the interconnection wafer are simultaneously brazed. The fabricated part is cooled and then cleaned in a chlorinated solvent. The bases are then stored in a dehydrated enclosure.

The fitted assembly can undergo surface treatment by electrolytic deposition involving the deposit of bright nickel with a thickness of 0.5 to 1μm, this nickel layer itself being coated with a 0.4- to 0.6-μm-thick gold deposit.

What is claimed is:

1. A base for a semiconductor laser, comprising a monolithic metal support having a base portion, a prismatic part formed on said base portion, and a planar holder formed on said base portion and arranged adjacent said prismatic part, said prismatic part being formed by two planes inclined relative to a plane of symmetry and having a slot in said plane of symmetry, a metal strip being brazed into said slot, said strip having a polished edge for receiving a laser chip whose length is substantially equal to the thickness of said strip, said planar holder having a parallelepipedic interconnection wafer brazed thereon, which is formed by an insulating substrate covered with a metal coating, said wafer being connectible by means of a connection to said laser chip.

2. A base according to claim 1, wherein the support and the strip comprises copper.

3. A base according to claim 1, wherein the interconnection wafer is constituted by a fritted alumina substrate, one face of which is covered by a printed conductive coating.

4. A base according to claim 3, wherein the interconnection wafer is coated on the face which is to be in contact with the holder by a heat-conducting coating comprising a silver-palladium paste.

5. A base according to claim 1, wherein said base is covered with an electrolytic nickel deposit, said deposit in turn being coated with a gold deposit.

6. A base according to claim 2, wherein said base is covered with an electrolytic nickel deposit, said deposit in turn being coated with a gold deposit.

7. A base according to claim 3, wherein said base is covered with an electrolytic nickel deposit, said deposit in turn being coated with a gold deposit.

8. A base according to claim 4, wherein said base is covered with an electrolytic nickel deposit, said deposit in turn being coated with a gold deposit.

* * * * *